United States Patent
Chen et al.

(10) Patent No.: US 9,431,066 B1
(45) Date of Patent: Aug. 30, 2016

(54) CIRCUIT HAVING A NON-SYMMETRICAL LAYOUT

(71) Applicant: TAIWAN SEMICONDUCTOR MANUFACTURING COMPANY, LTD., Hsinchu (TW)

(72) Inventors: Jui-Lin Chen, Taipei (TW); Feng-Ming Chang, Zhubei (TW); Huai-Ying Huang, Jhonghe (TW); Kian-Long Lim, Hsinchu (TW); Ping-Wei Wang, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/658,982

(22) Filed: Mar. 16, 2015

(51) Int. Cl.
| | |
|---|---|
| G11C 5/06 | (2006.01) |
| G06F 17/50 | (2006.01) |
| G11C 7/18 | (2006.01) |
| G11C 5/04 | (2006.01) |
| G11C 5/02 | (2006.01) |
| G11C 11/4097 | (2006.01) |

(52) U.S. Cl.
CPC .......... *G11C 5/063* (2013.01); *G06F 17/5072* (2013.01); *G11C 5/025* (2013.01); *G11C 5/04* (2013.01); *G11C 7/18* (2013.01); *G11C 11/4097* (2013.01)

(58) Field of Classification Search
CPC ......... G11C 5/063; G11C 5/025; G11C 5/04; G11C 7/18; G11C 11/4097
USPC .................................................. 365/63, 190
See application file for complete search history.

(56) References Cited

U.S. PATENT DOCUMENTS

| | | | |
|---|---|---|---|
| 7,269,056 B1* | 9/2007 | Liaw | G11C 5/063 257/903 |
| 8,421,205 B2 | 4/2013 | Yang | |
| 8,661,389 B2 | 2/2014 | Chern et al. | |
| 8,698,205 B2 | 4/2014 | Tzeng et al. | |
| 8,737,107 B2* | 5/2014 | Liaw | G11C 11/412 365/63 |
| 8,826,212 B2 | 9/2014 | Yeh et al. | |
| 8,836,141 B2 | 9/2014 | Chi et al. | |
| 2007/0235765 A1* | 10/2007 | Liaw | H01L 27/11 257/207 |
| 2007/0263428 A1* | 11/2007 | Ishii | G11C 5/063 365/154 |
| 2008/0019171 A1* | 1/2008 | Liaw | G11C 11/412 365/174 |
| 2014/0215420 A1 | 7/2014 | Lin et al. | |
| 2014/0264924 A1 | 9/2014 | Yu et al. | |
| 2014/0282289 A1 | 9/2014 | Hsu et al. | |
| 2014/0325466 A1 | 10/2014 | Ke et al. | |

\* cited by examiner

*Primary Examiner* — Pho M Luu
(74) *Attorney, Agent, or Firm* — Hauptman Ham, LLP

(57) ABSTRACT

A circuit comprises a first voltage line, a second voltage line parallel to the first voltage line, and a bit line between the first voltage line and the second voltage line. The bit line is separated from the first voltage line by a minimum distance allowed by a design rule. The bit line is closer to the first voltage line than to the second voltage line. A first capacitance value between the bit line and the first voltage line is different than a second capacitance value between the bit line and the second voltage line.

20 Claims, 5 Drawing Sheets

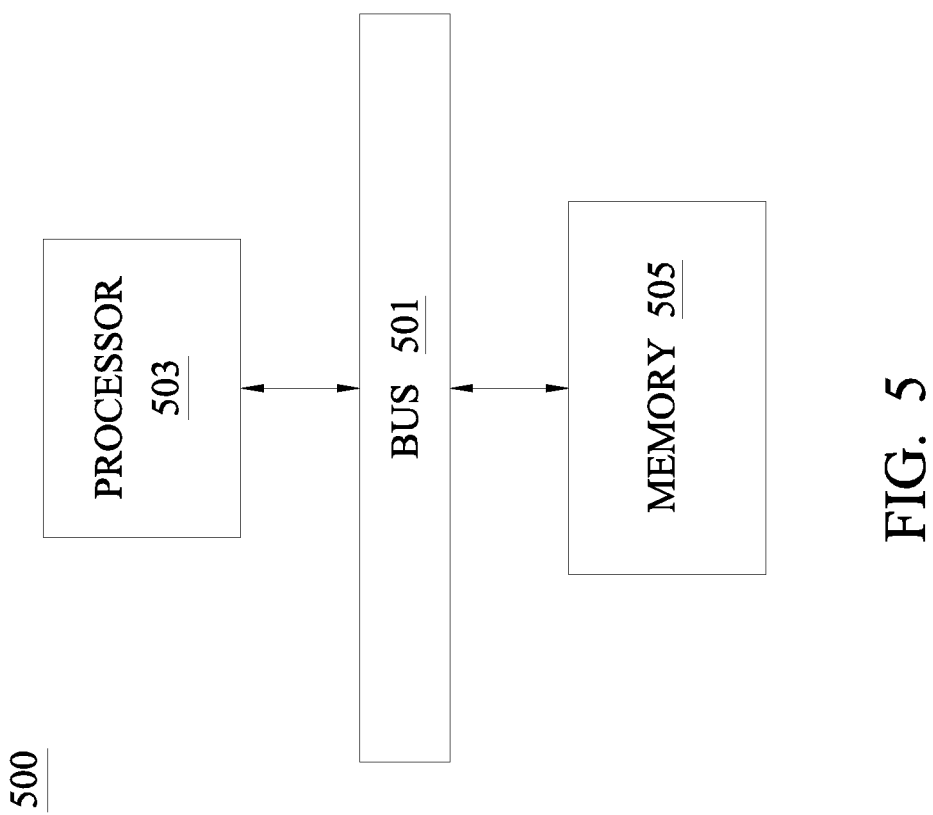

CIRCUIT HAVING A NON-SYMMETRICAL LAYOUT

BACKGROUND

Some integrated circuits, such as memory cells, comprise bit lines, word lines, and voltage lines. In some instances, a signal delay occurs in bit lines (hereinafter referred to as bit line delay) that slows a read speed of a memory cell. Bit line delay is often caused by a parasitic capacitance between the voltage lines and the bit lines. Circuit designers are challenged to maximize various performance features of integrated circuits such as read speeds in memory cells.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5 is a functional block diagram of a computer or processor-based system upon which or by which an embodiment is implemented.

DETAILED DESCRIPTION

Figure 1:
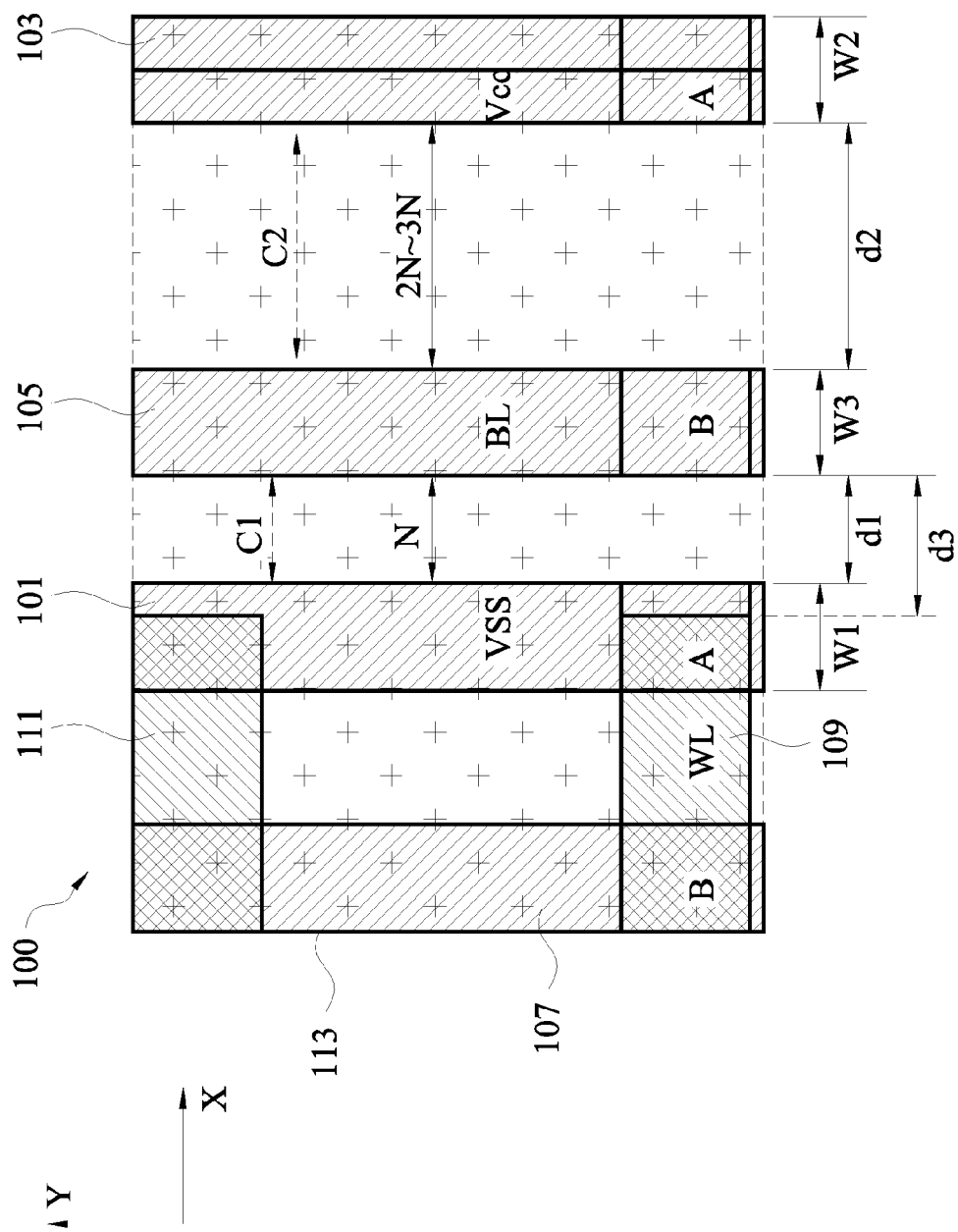
FIG. 1 is a plan view of a circuit having a non-symmetrical layout, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Bit line delay is often caused by a parasitic capacitance between voltage lines and bit lines. In at least some embodiments, integrated circuits include a bit line between two voltage lines such that the bit line is centered between the voltage lines. In some embodiments, design rules dictate a space between one of the voltage lines and the bit line and/or a width of the voltage lines and the bit line. Because the bit line is centered between the voltage lines, the parasitic capacitance that causes the bit line delay is at a maximum. A non-symmetrical integrated circuit configuration; however, makes it possible to minimize the parasitic capacitance between the voltage lines and the bit line, while still producing an integrated circuit that is in compliance with the design rules.

FIG. 1 is a plan view of a circuit 100 having a non-symmetrical layout, in accordance with one or more embodiments. The non-symmetrical layout of the circuit 100 reduces a bit line delay caused by parasitic capacitance in the circuit 100.

Circuit 100 comprises a first voltage line 101, a second voltage line 103, and a first bit line 105. First bit line 105 is between the first voltage line 101 and the second voltage line 103. Circuit 100 also comprises a second bit line 107 on a side of the first voltage line 101 opposite the first bit line 105. Circuit 100 further comprises a first word line 109 over the first voltage line 101 and the second bit line 107. Circuit 100 additionally comprises a second word line 111 over the first voltage line 101 and the second bit line 107. The first voltage line 101, the second voltage line 103, the first bit line 105, the second bit line 107, the first word line 109, and the second word line 111 are over a substrate 113.

First voltage line 101, second voltage line 103, first bit line 105, and second bit line 107 each extend in a first direction Y. First voltage line 101, second voltage line 103, first bit line 105, and second bit line 107 are parallel to one another. In some embodiments, at least one of the first voltage line 101, the second voltage line 103, the first bit line 105 or the second bit line 107 is askew with respect to the first direction Y. In some embodiments, more than one of the first voltage line 101, the second voltage line 103, the first bit line 105 or the second bit line 107 is askew with respect to the first direction Y.

The first bit line 105 is between the first voltage line 101 and the second voltage line 103. A first capacitance C1 occurs between the first voltage line 101 and the first bit line 105. A second capacitance C2 occurs between the second voltage line 103 and the first bit line 105. The first bit line 105 is closer to the first voltage line 101 than the first bit line 105 is to the second voltage line 103. Accordingly, the first capacitance C1 between the first bit line 105 and the first voltage line 101 is different in comparison with the second capacitance C2 between the first bit line 105 and the second voltage line 103.

The first bit line 105 is separated from the first voltage line 101 by a first distance d1. First distance d1 is equal to a minimum space between the first voltage line 101 and the first bit line 105 that is allowed by a design rule associated with manufacturing the circuit 100. The first bit line 105 is separated from the second voltage line 103 by a second distance d2. In at least one embodiment, second distance d1 is about two to three times the first distance d1. If the first distance d1 separates the first voltage line 101 from the first bit line 105 by a space that is N units of measurement long, then the second distance d2 separates the second voltage line 103 from the first bit line 105 by a space that is in a range of about 2N to about 3N units of measurement long. The first distance d1 and the second distance d2 are measured in a second direction X that is perpendicular to the first direction Y. In some embodiments, the first distance d1 and the second direction d2 are measured in a different direction, for example, if the first bit line 105 is askew with respect to the first direction Y. If the first bit line 105 is askew with respect to the first direction Y, then the first distance d1 and the second distance d2 are each based on an average distance of the first bit line 105 from the first voltage line 101 and the second voltage line 103, respectively. In some embodiments, if the first bit line 105 is askew with respect to the first direction Y, then the first distance d1 and the second distance d2 are each based on a shortest distance of the first bit line 105 from the first voltage line 101 and the second voltage line 103, respectively. In some embodiments, if the first bit line 105 is askew with respect to the first direction Y, then the first distance d1 and the second distance d2 are each based on a farthest distance of the first bit line 105 from the first voltage line 101 and the second voltage line 103, respectively.

The first capacitance C1 and the second capacitance C2 are determinable based, for example, on the following formula:

$$C = \varepsilon \frac{A}{\text{space}} \quad (1)$$

where C is the determined first capacitance C1 or the second capacitance C2; $\varepsilon$ is the permittivity of the space between the first voltage line 101 and the first bit line 105 or the space between the second voltage line 103 and the first bit line 105; space is the first distance d1 or the second distance d2; and A is an area of overlap between first voltage line 101 and the first bit line 105 or the second voltage line 103 and the first bit line 105. Other suitable formulas are capable of being used to determine the first capacitance C1 and/or the second capacitance C2.

Based on formula (1), the first capacitance C1 is dependent on at least the first distance d1 between the first voltage line 101 and the first bit line 105. Similarly, based on formula (1), the second capacitance C2 is dependent on at least the second distance d2 between the second voltage line 103 and the first bit line 105. As such, if the first distance d1 is less than the second distance d2, and the overlapping areas of the first voltage line 101, the second voltage line 103 and the first bit line 105 are equal, then the first capacitance C1 is greater than the second capacitance C2. Because the first distance d1 is equal to the minimum distance allowed by the design rule, and because the second capacitance C2 is greater than the first capacitance C1, circuit 100 is in compliance with the design rule and has a reduced bit line delay compared with a circuit that has a bit line that is symmetrically spaced between two voltage lines.

The first voltage line 101 has a first width W1 extending in the second direction X. The second voltage line 103 has a second width W2 extending in the second direction X. The first bit line 105 has a third width W3 extending in the second direction X. In some embodiments, the second width W2 is equal to the third width W3. In some embodiments, the second width W2 is less than the third width W3. In some embodiments, the second width W2 is greater than the third width W3. In some embodiments, the first width W1 is equal to the second width W2 and the third width W3. In some embodiments, the first width W1 is different in comparison with at least one of the second width W2 and the third width W3.

In some embodiments, the first distance d1 and/or the second distance d2 is based on the first width W1, the second width W2 and/or the third width W3. In some embodiments, the second distance d2 separates the second word line 103 from the first bit line 105 by a space that is based on a difference between the third width W3 and the second width W2. For example, if third width W3 is M units of measurement greater than the second width W2, and the first distance d1 separates the first voltage line 101 from the first bit line 105 by N units of measurement, then the second distance d2 separates the second voltage line 103 from the first bit line 105 by a space of about 2N to about 3N minus M units of measurement.

The first word line 109 and the second word line 111 over the first voltage line 101 are separated from the first bit line 105 by a third distance d3. The third distance d3 is measured in the second direction X. In some embodiments, the third distance d3 is measured in a different direction, for example, if the first bit line 105 is askew with respect to the first direction Y. Third distance d3 is greater than or equal to first distance d1. In some embodiments, the third distance d3 is less than the first distance d1. In some embodiments, the first word line 109 is separated from the first bit line 105 by a distance that is different from a distance that the second word line 111 is separated from the first bit line 105.

Substrate 113 comprises a semiconductor material such as silicon or another suitable substrate material. The first voltage line 101 and the second voltage line 103 comprise a conductive material such as copper, gold, another metal, or some other suitable material. The first bit line 105 and the second bit line 107 comprise a conductive material such as copper, gold, another metal, or some other suitable material. First voltage line 101 and second voltage line 103 are patterned based on a first mask pattern A. First bit line 105 and second bit line 107 are patterned based on a second mask pattern B. In some embodiments, lines formed based on the first mask pattern A comprise a same material and lines formed based on the second mask pattern B comprise a same material. In some embodiments, the first voltage line 101 and the second voltage line 103 comprise a same material as the first bit line 105 and the second bit line 107. In some embodiments, lines formed based on the first mask pattern A and lines formed based on the second mask pattern B comprise different materials.

Figure 2:
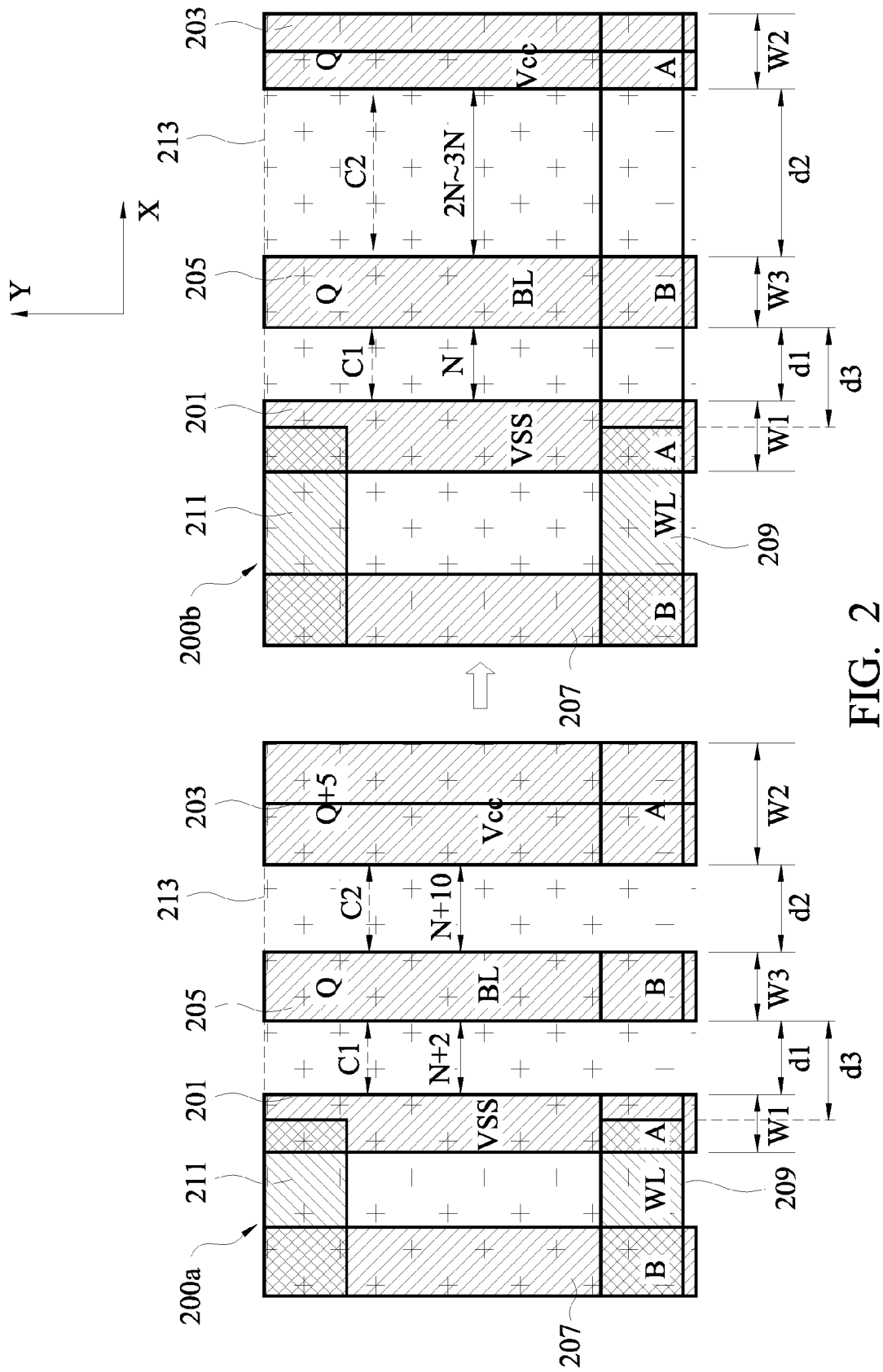
FIG. 2 is a flowchart of a plan view of a circuit modified to be in compliance with at least one design rule and to minimize a capacitance, in accordance with some embodiments.

FIG. 2 is a flowchart of a plan view of a circuit 200a that is modified to be in compliance with at least one design rule and to minimize the second capacitance C2, thereby becoming a plan view of a circuit 200b, in accordance with one or more embodiments. Circuits 200a and 200b comprise many of the features discussed with respect to circuit 100 (FIG. 1), with the reference numerals increased by 100.

In this example embodiment, the design rule mandates that the first distance d1 separate the first voltage line 201 from the first bit line 205 by a space of N units of measurement. The design rule also mandates that the lines patterned based on mask pattern A and mask pattern B have a minimum width of Q units of measurement. In some embodiments, other design rules are applicable to forming a circuit such as circuit 200b.

In circuit 200a, the first voltage line 201, the second voltage line 203, the first bit line 205 and the second bit line 207 are laid out extending in the first direction Y. The first word line 209 and the second word line 211 are laid out extending in the second direction X. In circuit 200a, the first distance d1 separates the first voltage line 201 from the first bit line 205 by a space that is N+2 units of measurement. The second distance d2 separates the second voltage line 203 from the first bit line 205 by a space that is N+10 units of measurement. The first distance d1 exceeds the mandated space N specified by the design rule by 2 units of measurement.

In circuit 200a, the third width W3 of first bit line 105 is equal to Q units of measurement, which is in compliance with the design rule. The second width W2 of the second voltage line 203 is equal to Q+5 units of measurement, which is greater than the minimum Q units of measurement for the width of second voltage line 205 mandated by the design rule. The second width W2 of the second voltage line 203 is therefore in compliance with the design rule.

Transitioning the circuit 200a to circuit 200b provides an opportunity to minimize the second capacitance C2 to reduce the bit line delay in the first bit line 205. For example, if the first distance d1 is set to be equal to N units of measurement, the second width W2 is set to be the minimum width of Q units of measurement allowed by the design rule, and the third width W3 is set to be the minimum width of Q units of measurement allowed by the design rule, then the second distance d2 is maximized. Maximizing the second distance d2 minimizes the second capacitance C2, which reduces bit line delay in first bit line 205.

As such, if circuit 200a is modified to be in compliance with the design rule, and the second capacitance C2 is to be minimized, the transition from circuit 200a to circuit 200b causes a shift in a position of the first bit line 205 toward the first voltage line 201 and the second width W2 of the second voltage line 203 to be minimized, which maximizes the second distance d2 and minimizes the second capacitance C2.

Figure 3:
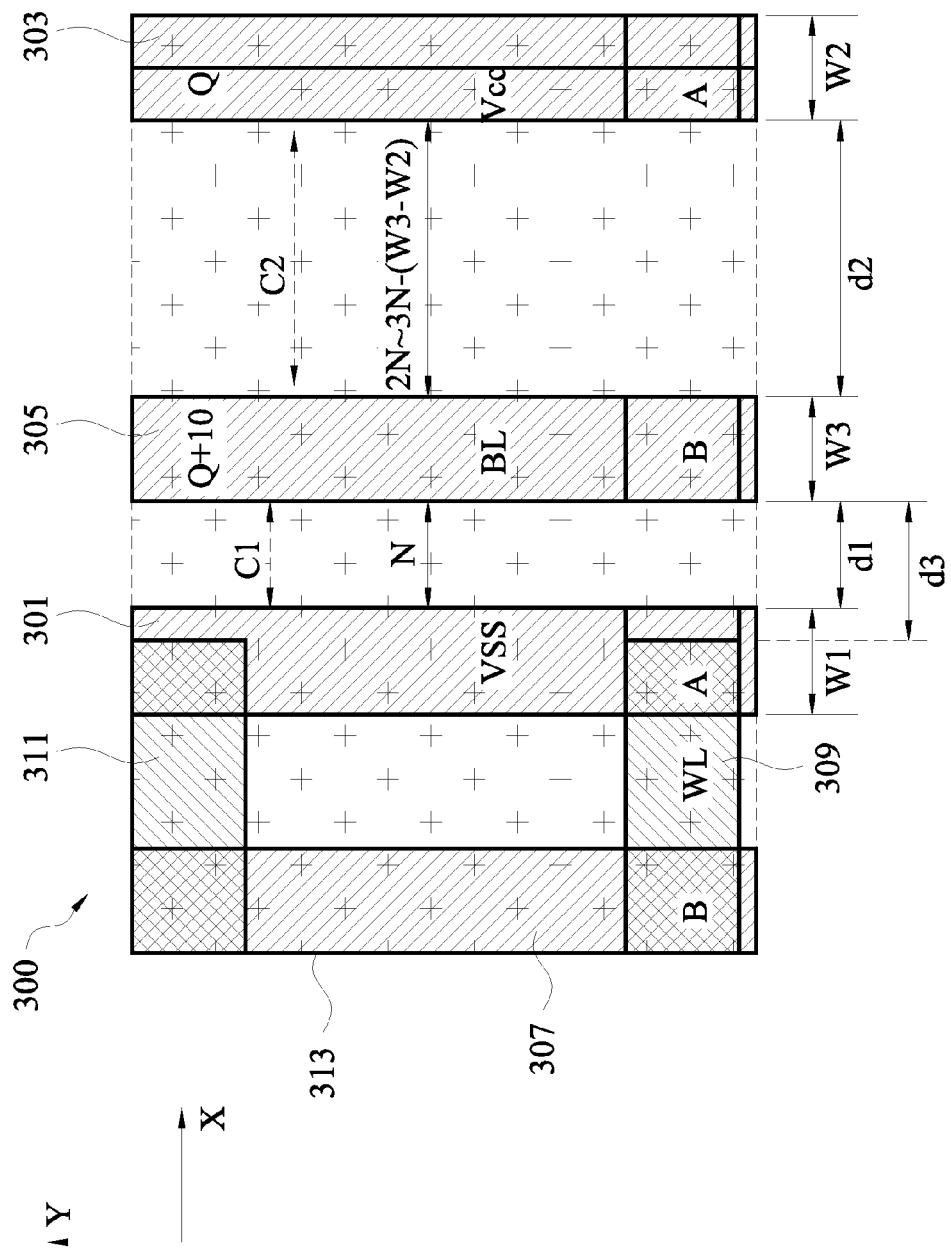
FIG. 3 is a plan view of a circuit having a non-symmetrical layout, in accordance with some embodiments.

FIG. 3 is a plan view of a circuit 300 having a non-symmetrical layout, in accordance with one or more embodiments. Circuit 300 comprises many of the features discussed with respect to circuit 100 (FIG. 1), with the reference numerals increased by 200.

Circuit 300 includes a first bit line 305 that has a third width W3 of Q+10 units of measurement. Second width W2 is Q units of measurement wide. Circuit 300 is in compliance with a design rule that mandates a minimum space of N units of measurement between the first voltage line 301 and the first bit line 305. To form circuit 300, first bit line 305 was allowed to expand in the second direction X toward the second voltage line 303. Prior to the expansion, first bit line 305 initially had a third width W3 of Q units of measurement like first bit line 205 of circuit 200b of FIG. 2. First bit line 305 was also initially separated from first voltage line 301 by the minimum space of N units of measurement.

To have the third width W3 of Q+10 units of measurement and the minimum space of N units remain, the side of the first bit line 305 nearest the first voltage line 301 was constrained during the expansion. Constraining the first side of the first bit line 305 during the expansion caused the circuit 300 to remain in compliance with the design rule that mandates a space of N units of measurement between the first voltage line 301 and the first bit line 305, even after the first bit line 305 expanded toward the second voltage line 303. Because first bit line 305 is expanded toward second voltage like 303 compared to circuit 200b (FIG. 2), the second distance d2 is reduced by the amount that the first bit line 305 expands toward the second voltage line 303. As such, the second capacitance value C2 in circuit 300 is greater than the second capacitance value C2 in circuit 200b.

In some embodiments, a process by which the circuit 300 is manufactured allows the first bit line 305 to expand as discussed. In some embodiments, the expansion is a function of a material of the first bit line 305. In some embodiments, the expansion is a function of the process by which the circuit 300 in manufactured. Accordingly, the expansion is an expected result that occurs when manufacturing the circuit 300. Because the expansion is an expected result that occurs during a process by which the circuit 300 is manufactured, the second capacitance C2 is minimized as much as possible to reduce the bit line delay in the first bit line 305 during the design process.

Figure 4:
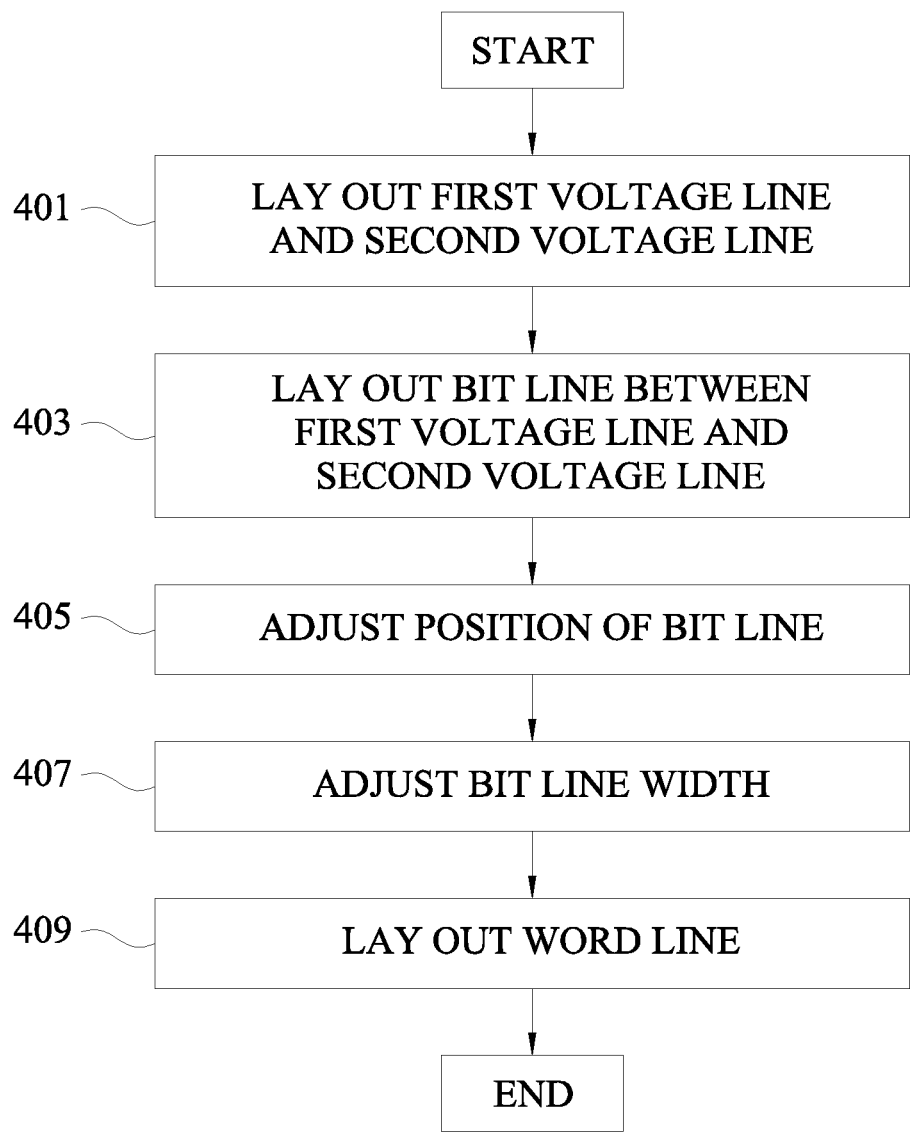
FIG. 4 is a flowchart of a method of forming a circuit having a non-symmetrical layout, in accordance with some embodiments.

FIG. 4 is a method 400 of forming a circuit such as circuit 100 (FIG. 1), in accordance with one or more embodiments. In some embodiments, method 400 is performed by a processor such as processor 503 (FIG. 5).

In step 401, a first voltage line and a second voltage line are laid out over a substrate. The second voltage line is laid out to be parallel to the first voltage line.

In step 403, a bit line is laid out between the first voltage line and the second voltage line. The bit line being laid out parallel to the first voltage line. The bit line has a first side proximate the first voltage line and a second side proximate the second voltage line.

In step 405, a position of at least one of the first side of the bit line or the second side of the bit line is adjusted to cause the bit line to be closer to the first voltage line than to the second voltage line. In some embodiments, adjusting the position of at least one of the first side of the bit line or the second side of the bit line causes the first voltage line to be separated from the bit line by a first distance and the second voltage line to be separated from the bit line by a second distance. The second distance is caused to be at least two times greater than the first distance. In some embodiments, the second distance is caused to be less than or equal to about three times the first distance.

In step 407, one or more of the second width of the second voltage line or the third width of the first bit line is adjusted. In some embodiments, the adjustment of one or more of the second width or the third width causes the second width to be equal to the third width. In some embodiments, the adjustment of one or more of the second width or the third width causes the second width to be less than the third width. In some embodiments, the adjustment corresponds to an allowed expansion of the first bit line toward the second voltage line during a manufacturing process of the circuit. If the adjustment corresponds to the allowed expansion of the bit line toward the second voltage line, then adjusting the position of at least one of the first side of the bit line or the second side of the bit line causes the first voltage line to be separated from the bit line by a first distance and the second voltage line to be separated from the bit line by a second distance. The second distance is caused to be about two to three times greater than the first distance minus a difference between second width and the third width. In some embodiments, if the third width of the bit line is expanded, the first side of the bit line is constrained in a predetermined position associated with a design rule associated with the distance between the first voltage line and the bit line. Constraining the first side of the bit line allows the bit line to expand toward the second voltage line such that the distance between the first voltage line and the bit line remains in compliance with the design rule during and after the expansion.

In step 409, a word line is laid out over the first voltage line, and the word line is caused to be separated from the bit line in a plan view of the circuit. In some embodiments, the word line is caused to be separated from the bit line by at least a distance equal to a distance the first voltage line is separated from the bit line.

FIG. 5 is a functional block diagram of a computer or processor-based system 500 upon which or by which an embodiment is implemented.

Processor-based system 500 is programmable to generate a circuit having a non-symmetrical layout, as described herein, and includes, for example, bus 501, processor 503, and memory 505 components.

In some embodiments, the processor-based system is implemented as a single "system on a chip." Processor-based system 500, or a portion thereof, constitutes a mechanism for generating a circuit having a non-symmetrical layout. In some embodiments, the processor-based system 500 includes a communication mechanism such as bus 501 for transferring information and/or instructions among the components of the processor-based system 500. Processor 503 is connected to the bus 501 to obtain instructions for execution and process information stored in, for example, the memory 505. In some embodiments, the processor 503 is also accompanied with one or more specialized components to perform certain processing functions and tasks such as one or more digital signal processors (DSP), or one or more application-specific integrated circuits (ASIC). A DSP typically is configured to process real-world signals (e.g., sound) in real time independently of the processor 503. Similarly, an ASIC is configurable to perform specialized functions not easily performed by a more general purpose processor. Other specialized components to aid in performing the functions described herein optionally include one or more field programmable gate arrays (FPGA), one or more controllers, or one or more other special-purpose computer chips.

In one or more embodiments, the processor (or multiple processors) 503 performs a set of operations on information as specified by a set of instructions stored in memory 505 related to generating a circuit having a non-symmetrical layout. The execution of the instructions causes the processor to perform specified functions.

The processor 503 and accompanying components are connected to the memory 505 via the bus 501. The memory 505 includes one or more of dynamic memory (e.g., RAM, magnetic disk, writable optical disk, etc.) and static memory (e.g., ROM, CD-ROM, etc.) for storing executable instructions that when executed perform the steps described herein to generate a circuit having a non-symmetrical layout. The memory 505 also stores the data associated with or generated by the execution of the steps.

In one or more embodiments, the memory 505, such as a random access memory (RAM) or any other dynamic storage device, stores information including processor instructions for generating an integrated circuit comprising tap cells. Dynamic memory allows information stored therein to be changed. RAM allows a unit of information stored at a location called a memory address to be stored and retrieved independently of information at neighboring addresses. The memory 505 is also used by the processor 503 to store temporary values during execution of processor instructions. In various embodiments, the memory 505 is a read only memory (ROM) or any other static storage device coupled to the bus 501 for storing static information, including instructions, that is not changed. Some memory is composed of volatile storage that loses the information stored thereon when power is lost. In some embodiments, the memory 505 is a non-volatile (persistent) storage device, such as a magnetic disk, optical disk or flash card, for storing information, including instructions, that persists even when power supplied to the memory 505 is turned off.

The term "computer-readable medium" as used herein refers to any medium that participates in providing information to processor 503, including instructions for execution. Such a medium takes many forms, including, but not limited to computer-readable storage medium (e.g., non-volatile media, volatile media). Non-volatile media includes, for example, optical or magnetic disks. Volatile media include, for example, dynamic memory. Common forms of computer-readable media include, for example, a floppy disk, a flexible disk, a hard disk, a magnetic tape, another magnetic medium, a CD-ROM, CDRW, DVD, another optical medium, punch cards, paper tape, optical mark sheets, another physical medium with patterns of holes or other optically recognizable indicia, a RAM, a PROM, an EPROM, a FLASH-EPROM, an EEPROM, a flash memory, another memory chip or cartridge, or another medium from which a computer can read. The term computer-readable storage medium is used herein to refer to a computer-readable medium.

An aspect of this description relates to a circuit. The circuit comprises a first voltage line, a second voltage line parallel to the first voltage line, and a bit line between the first voltage line and the second voltage line. The bit line is separated from the first voltage line by a minimum distance allowed by a design rule. The bit line is closer to the first voltage line than to the second voltage line. A first capacitance value between the bit line and the first voltage line is different than a second capacitance value between the bit line and the second voltage line.

Another aspect of this description relates to a method of forming a circuit. The method comprises laying out a first voltage line. The method also comprises laying out a second voltage line parallel to the first voltage line. The method further comprises laying out a bit line between the first voltage line and the second voltage line. The bit line is laid out parallel to the first voltage line. The bit line has a first side proximate the first voltage line and a second side proximate the second voltage line. The method additionally comprises adjusting a position of at least one of the first side of the bit line or the second side of the bit line, causing the bit line to be closer to the first voltage line than to the second voltage line.

A further aspect of this description relates to a method of forming a circuit. The method comprises laying out a first voltage line. The first voltage line is laid out having a first width. The method also comprises laying out a second voltage line parallel to the first voltage line. The second voltage line is laid out having a second width. The method further comprises laying out a bit line between the first voltage line and the second voltage line. The bit line is laid out having a third width. The method further comprises constraining a first side of the bit line in a position based on a design rule associated with a distance between the first voltage line and the bit line. The method additionally comprises expanding the bit line toward the second voltage line. The first side of the bit line is constrained to keep the distance between the first voltage line and the bit line in compliance with the design rule during and after the bit line expands toward the second voltage line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
a first voltage line;
a second voltage line parallel to the first voltage line; and
a bit line between the first voltage line and the second voltage line, the bit line being separated from the first voltage line by a minimum distance allowed by a design rule,
wherein the bit line is closer to the first voltage line than to the second voltage line, and a first capacitance value between the bit line and the first voltage line is different than a second capacitance value between the bit line and the second voltage line.

2. The circuit of claim 1, wherein
the first voltage line, the second voltage line and the bit line extend in a first direction,
the first voltage line has a first width extending in a second direction different from the first direction, the second voltage line has a second width extending in the second direction, and the bit line has a third width extending in the second direction, and
the second width is equal to the third width.

3. The circuit of claim 1, wherein the first voltage line is separated from the bit line by a first distance, the second voltage line is separated from the bit line by a second distance, and the second distance is at least two times greater than the first distance.

4. The circuit of claim 3, wherein the second distance is less than or equal to about three times the first distance.

5. The circuit of claim 1, wherein
the first voltage line, the second voltage line and the bit line extend in a first direction,
the first voltage line has a first width extending in a second direction different from the first direction, the second voltage line has a second width extending in the second direction, and the bit line has a third width extending in the second direction, and
the second width is less than the third width.

6. The circuit of claim 5, wherein the first voltage line is separated from the bit line by a first distance, the second voltage line is separated from the bit line by a second distance, and the second distance is about two to three times greater than the first distance minus a difference between the second width and the third width.

7. The circuit of claim 1, further comprising:
a word line over the first voltage line and separated from the bit line in a plan view.

8. The circuit of claim 7, wherein the word line is separated from the bit line by at least a distance equal to a distance the first voltage line is separated from the bit line.

9. The circuit of claim 1, wherein the first capacitance value is greater than the second capacitance value.

10. A method of forming a circuit, the method comprising:
laying out a first voltage line;
laying out a second voltage line parallel to the first voltage line;
laying out a bit line between the first voltage line and the second voltage line, the bit line being laid out parallel to the first voltage line, the bit line having a first side proximate to the first voltage line and a second side proximate to the second voltage line; and
adjusting a position of at least one of the first side of the bit line or the second side of the bit line, causing the bit line to be closer to the first voltage line than to the second voltage line.

11. The method of claim 10, wherein the first voltage line is laid out having a first width, the second voltage line is laid out having a second width, and the bit line is laid out having a third width, and the method further comprises:
adjusting one or more of the second width or the third width.

12. The method of claim 11, wherein the adjusting the one or more of the second width or the third width causes the second width to be equal to the third width.

13. The method of claim 11, wherein the adjusting the one or more of the second width or the third width causes the second width to be less than the third width.

14. The circuit of claim 13, wherein the adjusting the position of at least one of the first side of the bit line or the second side of the bit line causes the first voltage line to be separated from the bit line by a first distance and the second voltage line to be separated from the bit line by a second distance, and the second distance is caused to be about two to three times greater than the first distance minus a difference between the second width and the third width.

15. The method of claim 10, wherein the adjusting the position of at least one of the first side of the bit line or the second side of the bit line causes the first voltage line to be separated from the bit line by a first distance and the second voltage line to be separated from the bit line by a second distance, and the second distance is caused to be at least two times greater than the first distance.

16. The method of claim 15, wherein the second distance is caused to be less than or equal to about three times the first distance.

17. The method of claim 10, further comprising:
laying out a word line over the first voltage line; and
causing the word line to be separated from the bit line in a plan view.

18. The method of claim 17, wherein the word line is caused to be separated from the bit line by at least a distance equal to a distance the first voltage line is separated from the bit line.

19. The method of claim 10, wherein the first voltage line is separated from the bit line by a first distance, the second voltage line is separated from the bit line by a second distance, the position of the first side of the bit line is adjusted until the first distance is in compliance with a first design rule associated with the first distance, and the position of the second side of the bit line is adjusted to maximize the second distance in compliance with a second design rule associated with a minimum width of the bit line.

20. A method of forming a circuit, the method comprising:
laying out a first voltage line, the first voltage line being laid out having a first width;
laying out a second voltage line, the second voltage line being laid out having a second width;
laying out a bit line between the first voltage line and the second voltage line, the bit line being laid out having a third width;
constraining a first side of the bit line in a position based on a design rule associated with a distance between the first voltage line and the bit line; and
expanding the bit line toward the second voltage line,
wherein the first side of the bit line is constrained to keep the distance between the first voltage line and the bit line in compliance with the design rule during and after the bit line expands toward the second voltage line.

* * * * *